(12) United States Patent
Di Palma et al.

(10) Patent No.: US 9,099,529 B2
(45) Date of Patent: Aug. 4, 2015

(54) METHOD OF FORMING A CONDUCTIVE POLYMER MICROSTRUCTURE

(71) Applicant: STMicroelectronics S.r.l., Agrate Brianza (IT)

(72) Inventors: Vincenza Di Palma, Cimitile (IT); Andrea Di Matteo, Naples (IT); Luigi Giuseppe Occhipinti, Ragusa (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 0 days.

(21) Appl. No.: 14/032,067

(22) Filed: Sep. 19, 2013

(65) Prior Publication Data

US 2014/0087552 A1   Mar. 27, 2014

(30) Foreign Application Priority Data

Sep. 25, 2012   (IT) ................. VI2012A0237

(51) Int. Cl.
| | |
|---|---|
| H01L 21/00 | (2006.01) |
| H01L 35/24 | (2006.01) |
| H01L 29/00 | (2006.01) |
| H01L 21/768 | (2006.01) |
| H01L 21/321 | (2006.01) |
| H01L 51/00 | (2006.01) |
| H01L 51/05 | (2006.01) |

(52) U.S. Cl.
CPC .... *H01L 21/76805* (2013.01); *H01L 21/32115* (2013.01); *H01L 51/0023* (2013.01); *H01L 51/0018* (2013.01); *H01L 51/0516* (2013.01)

(58) Field of Classification Search
CPC .......................... H01L 21/768; H01L 21/321
USPC ............................... 438/99, 758, 780
See application file for complete search history.

(56) References Cited

U.S. PATENT DOCUMENTS

| | | | | |
|---|---|---|---|---|
| 6,955,939 B1* | 10/2005 | Lyons et al. | ............. | 438/82 |
| 2003/0010241 A1* | 1/2003 | Fujihira et al. | ............. | 101/483 |
| 2009/0294404 A1* | 12/2009 | Colpo et al. | ............. | 216/67 |
| 2010/0090221 A1 | 4/2010 | Hayton et al. | | |
| 2011/0175192 A1* | 7/2011 | Park | ............. | 257/529 |

FOREIGN PATENT DOCUMENTS

| | | |
|---|---|---|
| WO | 2007/110671 A2 | 10/2007 |
| WO | 2008/122774 A1 | 9/2013 |

OTHER PUBLICATIONS

Low-cost fabrication of submicron all polymer field effect transistors J. Z. Wang, J. Gu, F. Zenhausern, and H. Sirringhaus Citation: Applied Physics Letters 88, 133502 (2006); doi: 10.1063/1.2191088.*

(Continued)

*Primary Examiner* — Kimberly Rizkallah
*Assistant Examiner* — Brian Turner
(74) *Attorney, Agent, or Firm* — Seed IP Law Group PLLC

(57) ABSTRACT

The present disclosure relates to microstructure devices, in which a conductive pattern is formed on the basis of a conductive polymer material. In order to avoid the deposition and processing of the sacrificial materials and reduce a negative influence of the lithography process on sensitive conductive polymer materials a one-layer patterning sequence is proposed, in which a trench pattern is formed in a dielectric material that is subsequently filled with the conductive polymer material.

32 Claims, 4 Drawing Sheets

(56) References Cited

OTHER PUBLICATIONS

DeFranco, J.A., et al. "Photolithographic Patterning of Organic Electronic Materials", Organic Electronics, Elsevier, Amsterdam, NL, vol. 7, No. 1, Nov. 18, 2005, pp. 22-28, XP024972748.

Wang, J. et al., "Low-Cost Fabrication of Submicron All Polymer Field Effect Transistors", Applied Physics Letters, AIP, American Institute of Physics, Melville, NY, US, vol. 88, No. 13, Mar. 29, 2006, pp. 133502-133502, XP012080873.

Macaya et al., "Simple Glucose Sensors With Micromolar Sensitivity Based on Organic Electrochemical Transistors", Sensors and Actuators B: Chemical: International Journal Devoted to Research and Development of Physical and Chemical Transducers, Elsevier S.A, Switzerland, vol. 123, No. 1, Mar. 30, 2007, pp. 374-378, XP022011222.

Shim, Y. et al., "All-Plastic Electrochemical Transistor for Glucose Sensing Using a Ferrocene Mediator", Sensors, vol. 9, Dec. 4, 2009, pp. 9896-9902, XP002697300.

Takamatsu et al., "Micro-patterning of a conductive polymer and an insulation polymer using the Parylene lift-off method for electrochromic displays," *J. Micromech. Microeng.* 21:075021, 2011, 7 pages.

* cited by examiner

METHOD OF FORMING A CONDUCTIVE POLYMER MICROSTRUCTURE

BACKGROUND

1. Technical Field

The present disclosure generally relates to microstructures, such as electrochemical devices in the form of transistors, and the like, in which conductive parts thereof may at least partially be formed from conductive polymer materials.

2. Description of the Related Art

Over the last decades polymer materials have been used in a wide variety of applications in many technical fields due to the fact that these materials may be synthesized at low cost, while the material characteristics can be adjusted in a wide range so as to address specific technical demands. Generally, a polymer material is comprised of large molecules, which in turn consist of sub-groups of reduced size, called monomers, which undergo polymerisation upon establishing appropriate process conditions.

Since polymer materials may also be produced so as to exhibit a wide range of electrical characteristics, for instance having a very low conductivity corresponding to an electrical insulator, up to moderately high conductivity values, polymer materials have become well established materials for various electronic devices, such as light emitting diodes, electrode structures, transistors, and the like, thereby taking advantage of conductive and insulating characteristics of the different types of polymer materials used. For example, in recent approaches the electrochemical behavior of a wide class of polymer materials is taken advantage of when forming electrochemical devices in the form of light emitting electrochemical cells, display devices, batteries and in particular electrochemical transistors. A very promising technical field in this respect is the manufacturing of sophisticated low-cost sensor structures, which may be implemented on the basis of polymer materials. In electrochemical devices both electrons and ions serve as charge carriers when the polymer material is subjected to a reversible electrochemical reduction and oxidation process. For example, in an electrochemical transistor an impedance modulation is utilized by switching between different reduction/oxidation states of the active transistor material. In this manner, a high impedance state and a state of moderately high conductivity may be established in a controlled manner.

Irrespective of the charge carrier mechanism in the conductive polymer material, an appropriate layer structure is provided in order to implement the desired function on the basis of a conductive polymer material. Although generally electrochemical electronic devices, such as transistors, are significantly less sensitive to a variation in lateral size, for instance compared to "regular" semiconductor-based field effect transistors, nevertheless a precise patterning of the conductive polymer material is desired, in particular, when electronic devices or any other components have to be provided in the form of microstructure devices, which are to be understood as devices, in which at least one lateral dimension is several hundred micrometers and significantly less. Consequently, it has been proposed to apply well-established manufacturing techniques, in particular optical lithography techniques, in order to realize microstructure devices on the basis of conductive polymer materials, wherein, however, the characteristics of the conductive polymer material under consideration may have a significant influence on the applicability of these well-established patterning techniques in the context of a specific polymer material.

For example, poly(3,4-ethylenedioxythiophene) (PEDOT) is a well-established polymer-based material, which in combination with an appropriate concentration of poly(styrene sulphonate) (PSS) is frequently used as a conductive polymer material known as PEDOT:PSS. This material is an aqueous dispersion and has significant advantages in terms of chemical stability, moreover it can be easily processed from solution into thin films that are stable in a wide pH range. Furthermore, PEDOT:PSS is a commercially available conductive polymer blend that provides for very high conductivity compared to other conductive polymer materials, wherein the conductivity may be adjusted by incorporating appropriate components, such as Ethylene Glycol, 2-nitroethanol, Dimethylsulfoxide and the like. Furthermore, PEDOT:PSS may be applied as a thin continuous layer by well-established deposition techniques, such as spin coating and the like.

Since PEDOT:PSS has many advantageous characteristics for forming microstructures, for instance in the form of electrochemical devices, great efforts are being made in developing patterning strategies, in which feature sizes of critical dimensions in the range of several hundred micrometers and less may be realized on the basis of well established lithography techniques preventing a substantially "direct" patterning of the conductive polymer materials in order to avoid undue loss of conductivity, which may frequently be associated with a photolithographic patterning process of these materials. On the other hand PEDOT:PSS is soluble in water-based developers used in photolithography and is also soluble in alcoholic solutions, which are frequently used to remove the photoresist after the patterning process.

Complex patterning strategies have been recently developed, in which a sacrificial material layer is applied in order to protect the sensitive polymer material upon patterning a photo resist layer, which in turn may be used to transfer the desired micrometer pattern into the conductive polymer layer. For example, Parylene is an appropriate sacrificial material, which in combination with appropriate resist liftoff techniques may be used in order to obtain a desired layout of the conductive polymer material. To this end, however, a plurality of deposition processes in combination with the actual lithography process is utilized, followed by a complex liftoff process possibly in combination with an intermediate resist removal process. This complex overall process strategy significantly contributes to overall production costs, thereby offsetting many of the advantages offered by the cost effective conductive polymer material.

In other approaches a stack of sacrificial layers is patterned so as to include a desired pattern, wherein subsequently a thin layer of the conductive polymer material is deposited. Thereafter, the actual patterning of the conductive polymer materials is accomplished by peeling off the sacrificial layer stack, thereby also removing unwanted portion of the conductive polymer material.

In other approaches the conductive polymer material may directly be patterned on the basis of imprint techniques, which also benefits from significant effort in terms of providing appropriate templates and process strategies, while any dielectric materials may still have to be provided in additional process steps. In other approaches Inkjet printing techniques may be used to directly pattern the conductive polymer material, but these techniques demand extreme control of deposition parameters.

The above-described conventional process strategies for patterning a conductive polymer material allow the fabrication of microstructure devices, however, significant effort in terms of additional process steps and sacrificial materials is needed in order to comply with the characteristics of the conductive polymer materials with respect to a possible interaction with chemical solutions that are typically used in well-established photolithography processes.

BRIEF SUMMARY

Generally described, one or more embodiments of the present disclosure is directed to techniques for patterning conductive polymer materials on the basis of lithography techniques, such as optical lithography techniques, while reducing the usage of sacrificial materials and the number of process steps. To this end, a dielectric material of the microstructure device may be patterned first so as to receive a trench pattern having appropriate lateral dimensions as well as desired sidewall profiles of respective trenches. Thereafter, a desired conductive polymer material is deposited and appropriately treated so as to remove any excess material and/or adjust a desired height within trench portions previously formed in the dielectric material. In this manner, the actual patterning of the sensitive conductive polymer material is accomplished on the basis of a deposition process and a material removal process without requiring the deposition of sacrificial materials and complex liftoff techniques.

According to one aspect of the present disclosure a method is provided. The method comprises forming a trench pattern in a dielectric material, wherein the dielectric material is formed above a substrate. The method further comprises depositing a conductive polymer material above the substrate so as to fill the trench pattern. Additionally, the method includes forming a conductive polymer microstructure laterally isolated by the dielectric material, which in illustrative embodiments may be accomplished by removing an excess portion of the conductive polymer material.

In this aspect of the present disclosure the dielectric material is formed so as to include a desired trench pattern, which defines the lateral layout of a conductive pattern of the microstructure device. Consequently, well-established patterning techniques may be applied when defining the conductive pattern, however, without having to directly contact the sensitive conductive polymer material with chemical solutions, which may negatively affect the characteristics of the conductive polymer material.

In one illustrative embodiment forming the trench pattern comprises depositing a precursor of the dielectric material as a radiation sensitive material and transferring the trench pattern by applying a radiation based lithography process. Consequently, the actual patterning of the conductive pattern of the microstructure is accomplished with a minimum number of deposition processes, since the dielectric material or the precursor material thereof may also be used as the radiation sensitive material, into which a desired latent image may be transferred. The subsequent patterning of the dielectric material thus provides the dielectric components of the microstructure under consideration, thereby enabling a precise definition of the lateral dimensions and the sidewall profiles.

In one illustrative embodiment applying the radiation based lithography process comprises exposing portions of the dielectric material to radiation and removing the exposed portions. In this manner, the precursor of the dielectric material acts as a positive resist, in which portions to be removed react photo-chemically with the radiation, thereby establishing a lithography scheme as is also frequently used in semiconductor production techniques. In a further embodiment the precursor of dielectric material acts as a negative resist in which the photochemical reaction with the radiation allows to form the patterned trench and the unexposed areas are removed according to the photolithography technique.

In a further illustrative embodiment the method further comprises performing a heat treatment after forming the trench pattern and prior to depositing the conductive polymer material. During this heat treatment, material characteristics of the dielectric material may be improved and adhesion to any underlying material, such as the substrate material, may be enhanced. For example, during the heat treatment the polymerisation process may be completed and also unwanted residual solvents may be removed, which may previously have been applied in order to pattern the precursor material of the dielectric material.

In still further illustrative embodiment the method further comprises performing a post-deposition heat treatment on the conductive polymer material prior to removing an excess portion thereof. In this manner, the chemical stability of the resulting conductive polymer material may be increased, for instance by removing water or other solvents from the polymer material, thereby enhancing efficiency of the subsequent removal process.

According to one illustrative embodiment removing the excess portion of the conductive polymer material comprises performing an etch process. In this manner, well-established process recipes may be applied in order to efficiently remove unwanted portions of the conductive polymer material without requiring an etch mask. For example, the etch process may be implemented by establishing a plasma ambient, for instance based on oxygen, thereby obtaining a pronounced removal efficiency for the polymer material without significantly affecting other device areas. For example, an oxygen-based plasma removal process may efficiently be applied so as to adjust a desired height of the conductive polymer material within the trench pattern, while still avoiding undue material erosion in exposed portions of the dielectric material.

In other illustrative embodiments removing the excess portion of the conductive polymer material comprises performing a polishing process. In this manner, the interaction of a process atmosphere with the conductive polymer material and exposed portions of the dielectric material may be reduced compared to an exposure of these materials to an etch ambient or plasma ambient. In other cases the removal of the excess portion of the conductive polymer materials may be accomplished on the basis of a combination of an etch process, such as an oxygen plasma-based process, and a polishing process, for instance when any etch damage in a surface area of the conductive polymer material and/or in the dielectric material is considered inappropriate. In this case a final polishing step may be performed so as to clear the dielectric material. In still other illustrative embodiments, the polishing process may be performed first, for instance for removing the bulk of the conductive polymer material, followed by a well controlled etch step in order to adjust the final target height of the polymer material within the trench pattern.

In preferred embodiments the step of forming the trench pattern comprises forming the trench pattern so as to laterally correspond to a layout of at least a portion of a transistor. In this manner, sophisticated electronic configurations, such as sensors structures including one or more transistors, may be formed on the basis of well-established patterning strategies without compromising the material characteristics of the conductive polymer material.

In one illustrative embodiment the at least a portion of the layout comprises a drain terminal, a source terminal, a channel and a gate electrode. That is, the transistor components may be provided during a single patterning process on the basis of a one-layer configuration or a two-dimensional configuration, thereby taking advantage of the moderately high conductivity of the polymer material. That is, the drain and source terminals, which typically require a moderately high conductivity, may be formed in combination with the channel region, whose conductivity as to be modulated during the transistor operation. This is accomplished by applying well-established lithography techniques in combination with an appropriate dielectric material. For example, polyimide may efficiently be used as a radiation sensitive dielectric material, which additionally provides for low permittivity, which in turn ensures superior electronic characteristics of the resulting transistor structure.

In illustrative embodiments forming a trench pattern in the dielectric material comprises forming at least one trench portion so as to have at least one lateral dimension that is less than 100 μm (micrometer). That is, the microstructure of the present disclosure may be formed with any appropriate lateral dimensions, thereby complying with a wide area of applications, such as forming complex sensors structures in a myriad of solid-state electronics devices based on organic semiconductors, for chemical and biological detection or for electrodisplays or organic thin film transistors and the like. It should be appreciated, however, that providing reduced dimensions in the microstructure does not negatively affect the overall characteristics of the conductive polymer material due to the lithography process used, while still a very efficient overall process flow is achieved in terms of the number of process steps and sacrificial materials involved.

According to a further aspect of the present disclosure a method of forming a polymer microstructure is provided. The method comprises transferring a layout of a conductive pattern of the microstructure as a trench pattern into a dielectric material by performing an optical lithography process using the dielectric material as a radiation sensitive material during the optical lithography process. Furthermore, the method comprises filling the trench pattern with a conductive polymer material.

As already discussed above, the layout of the conductive pattern of the microstructure is transferred into the dielectric material on the basis of an optical lithography process, in which additional process steps may be avoided, for instance with respect to depositing a resist material, a sacrificial material, and the like, as is typically applied in conventional strategies. Consequently, the conductive pattern of the microstructure and the insulating regions of the microstructure may be provided in a very efficient process flow, wherein the actual provision of the conductive polymer material is accomplished on the basis of a non-masked deposition and material removal process.

In one illustrative embodiment filling the trench pattern comprises depositing the conductive polymer material and applying a removal process so as to adjust a target height of the conductive polymer material in the trench pattern.

Preferably the layout comprises a drain terminal, a source terminal, a channel and a gate electrode of an electrochemical transistor so that these components may be provided in a single patterning sequence within one and the same device layer. It should be appreciated, however, that the efficient process disclosed herein may also be applied at different device levels, when for instance a conductive structure embedded in an appropriate dielectric material is to be provided in subsequent layers, thereby providing the possibility of efficiently forming sophisticated three-dimensional microstructures on the basis of a conductive polymer material as above described.

As already discussed above, in some illustrative embodiments applying a removal process comprises applying a plasma based etch process and/or applying a polishing process.

Further advantageous embodiments, which relate to selective deposition techniques for a conductive polymer material by "patterning" the surface so as to have hydrophobic and hydrophilic surface portions, are described in the dependent claims and the detailed description.

BRIEF DESCRIPTION OF THE SEVERAL VIEWS OF THE DRAWINGS

Further illustrative embodiments of the present disclosure are also defined in the appended claims and in the description, which is to be studied in combination with the accompanying drawings, in which:

DETAILED DESCRIPTION

With reference to the accompanying drawings further illustrative embodiments of the present disclosure will now be described in more detail.

Figure 1A:
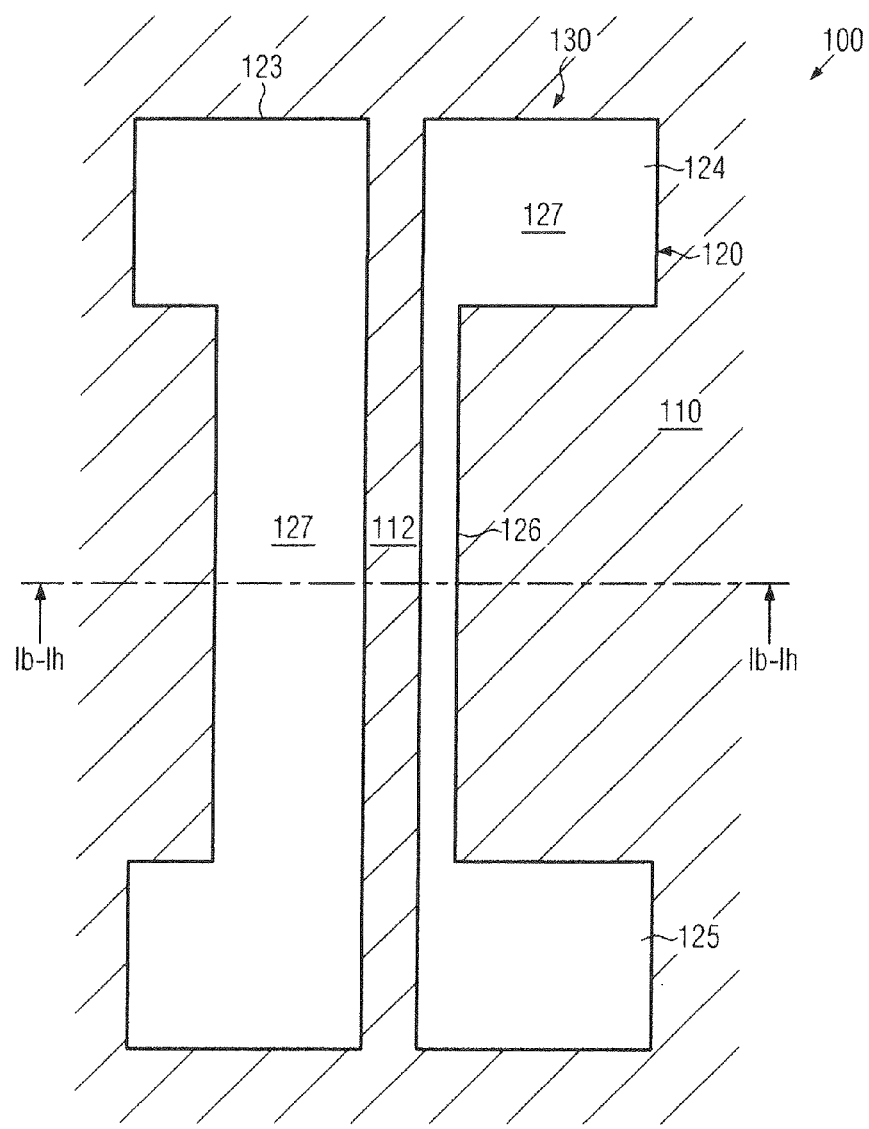
FIG. 1a schematically illustrates a top view of a microstructure device, wherein the layout of a conductive pattern formed on the basis of a trench pattern is illustrated, which is to be filled with a conductive polymer material for forming an electrochemical device, such as the transistor according to illustrative embodiments.

FIG. 1a schematically illustrates a top view of a microstructure device 100 that is formed on the basis of a conductive polymer material and an appropriate dielectric material by using an efficient patterning regime, in which sacrificial materials and a direct contact of a conductive polymer material, such as PEDOT:PSS, and the like, to critical chemicals, such as alcoholic solutions or developer materials is avoided.

The device 100 has a well-defined lateral geometric configuration, which may also be referred to herein as a layout, in order to obtain a specific electronic function of the device 100. In the example shown the device 100 may comprise a transistor structure 130, which is to be formed on the basis of an appropriate dielectric material 110 in combination with a conductive polymer material 127. To this end, a conductive or active structure or pattern 120 is appropriately embedded in the dielectric material 110, which thus provides for desired dielectric characteristics and also defines the lateral size and shape of the conductive or active pattern 120.

Examples of dielectric materials that can be used as the dielectric material 110 are polyimides, polymethylmethacrylate (PMMA), copolymers PMMA/methacrylic acid, epoxy resins, combinations of cresol novolak resins and naphtoquinone diazides and the like, these examples having different molecular masses and dissolved in a safer solvent, having a chemical and physical stability over 100° C. and having a low water swelling and resistant against moisture.

In an initial stage of the manufacturing process, the pattern 120 is provided as a trench pattern formed in the dielectric material 110, which is subsequently to be filled with the conductive polymer material 127, as will be discussed later on in more detail.

In the embodiment shown the microstructure 130 in the form of a transistor may have provided therein any components, such as a drain terminal 124, a source terminal 125, a channel region 126 connecting the drain terminal 124 and the source terminal 125, and a gate electrode 123, which is separated from the channel region 126 and the drain and source terminals 124, 125 by an intermediate insulating portion 112 of the dielectric material 110. It should be appreciated, however, that any other functional components of a conductive pattern may be formed in the dielectric material 110, depending on the overall configuration of the structure 130 and the device 100. For example, the design of a conductive pattern of transistors may significantly vary depending on the specific application and function of the transistor. Similarly, other electronic components, such as capacitive structures, light emitting structures, and the like, may utilize respectively adapted conductive, semiconductive and insulating regions, which can be implemented in the form of trenches of appropriate lateral size and shape that are to be filled with the conductive polymer material. In other cases some functional components may have to be provided as a stacked configuration, wherein each level of the stacked configuration may utilize a specific layout of conductive and dielectric areas, as illustratively shown in FIG. 1a.

In the embodiment shown, it is advantageous that all of the components of the transistor structure 130 may be formed on the basis of the layout or pattern 120, which is subsequently filled with the conductive polymer material, so that highly conductive areas, such as the drain and source terminals 124, 125 may be formed on the basis of the same polymer material as the channel region 126, which may desire a modulated or controllable conductivity behavior that may be obtained by the geometrical design of the pattern 120 in combination with an additional electrolyte material that is to be provided in a later manufacturing stage.

In other cases, the desired electronic function of the microstructure 130 may be obtained by lateral design on the basis of one and the same conductive polymer material, without requiring additional electrically active materials, such as an electrolyte, and the like, depending on the overall configuration of the structure 130.

Figure 1B:
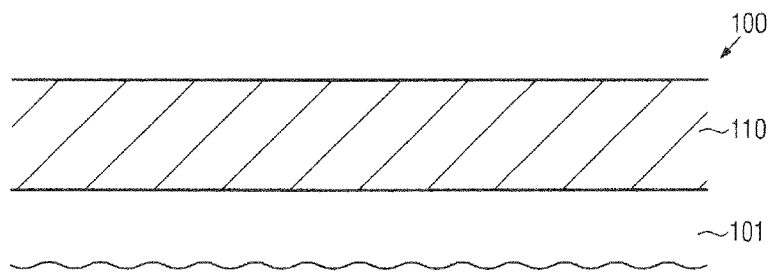
FIGS. 1b to 1g schematically illustrate cross-sectional views along the section line indicated in FIG. 1a during various manufacturing stages in forming a microstructure device on the basis of a conductive polymer material according to further illustrative embodiments.

FIG. 1b schematically illustrates a cross-sectional view of the device 100 in an early manufacturing stage, wherein the cross-section is taken along the line indicated in FIG. 1a. That is, in this manufacturing stage a substrate 101 of appropriate size and material characteristics, for instance provided in the form of a silicon material, glass, PEN (polyethylene naphtalate), PI (polyimide), and the like, which may be provided as a rigid or flexible material, is used as a carrier material of the device 100. Above the substrate 101 the dielectric material 110 may be provided, for instance so as to be in direct contact with the surface of the substrate 101, while in other cases, if considered appropriate, one or more additional (optionally adhesive) material layers (not shown) may be formed below the dielectric material 110. In one illustrative embodiment the dielectric material 110 is provided as a radiation sensitive material, such as a polyimide material, which is known to become soluble upon exposure to UV (Ultraviolet) radiation, thereby acting as a positive resist. In the manufacturing stage shown, the material 110 may be provided as a precursor, for instance as polybenzobisoxazole (PBO) which may be applied by any appropriate deposition technique, such as spin coating, and the like.

The layer 110 may be formed on the basis of the following process sequence. For example, as a first step the substrate 101 may be cleaned with an alcoholic solution and may be dried during a heat treatment so as to prepare the surface of the substrate 101 for receiving the precursor of the material 110 thereon. Thereafter, the precursor may be spin-coated onto the substrate 101 by using well-established spin-coating equipment and selecting appropriate process parameters, for instance 4000 to 8000 rounds per minute for a time interval of 20 to 40 seconds. Thereafter, a further heat treatment may be performed at approximately 120° C. to 130° C. for several minutes.

It should be appreciated, however, that any other appropriate process parameters may readily be determined on the basis of experiments, depending on the type of substrate used and depending on the type of precursor material used for forming the dielectric layer 110.

Figure 1C:
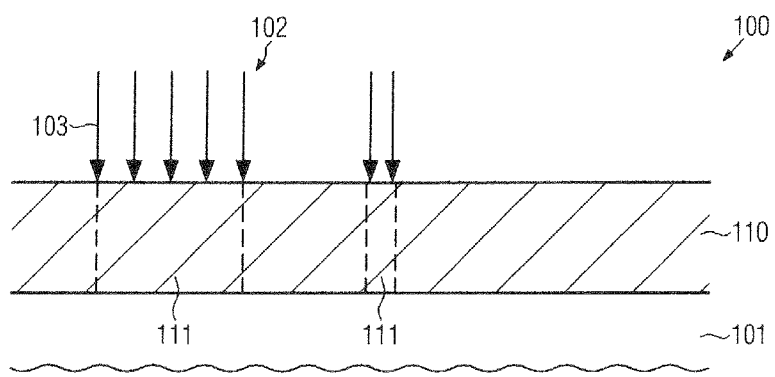

FIG. 1c schematically illustrates the device 100 in a further advanced manufacturing stage, in which the layer 110 is exposed to radiation 103 during a lithography process 102, in which the material of the layer 110 is locally subjected to a photochemical reaction in order to make exposed portions soluble during a subsequent development process. The lithography process 102 may be performed on the basis of an appropriate lithography mask (not shown), which may be brought into direct contact with the layer 110 or which may be used during a non-contact imaging process, depending on the overall process strategy used. Consequently, the photochemically modified portions 111 correspond to the conductive pattern 120 (cf. FIG. 1a), thereby allowing a precise transfer of the desired pattern into the layer 110. The lithography process 102 may be performed so as to appropriately initiate the photochemical reaction through the entire thickness of the layer 110, thereby allowing any target thickness of the layer 110 to be selected so as to comply with specifications for a dielectric material of the device 100 in the device level under consideration. For example, for a given intensity of the radiation 103 an appropriate exposure time may be selected so as to substantially completely modify the portions 111 in order that these portions may completely be removed during a subsequent development process.

Figure 1D:
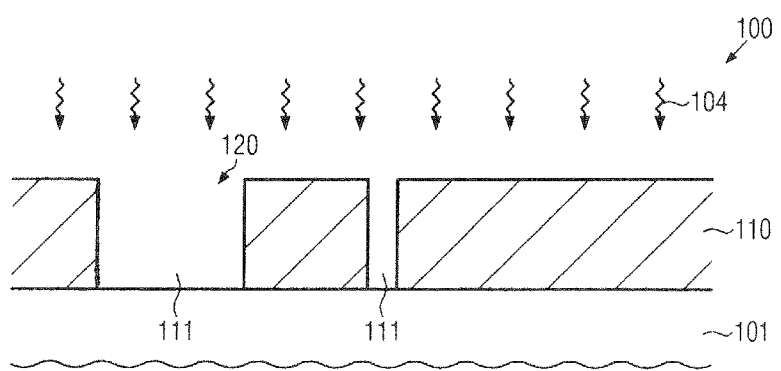

FIG. 1d schematically illustrates a cross-sectional view of the device 100 in a further advanced stage, in which the photo-chemically modified portions 111 (cf. FIG. 1c) have been removed on the basis of an appropriate material removal process, for instance using a developer solution containing a strong base in order to wash away the previously exposed portions. For example, the development process may be performed on the basis of TMAH (tetramethyl ammoniumhydroxide), which is a commercially available developer chemical. Appropriate concentration and process parameters, such as development time, may readily be determined on the basis of experiments. For example, well-established process recipes for removing positive resist may be used with a process time of 20 to 40 seconds. Thereafter, the device 100 may be rinsed with water followed by a heat treatment 104, which may be performed in an oven or any other appropriate process ambient. During the process 104 any residual solvents may be removed and the polymerisation process may be completed so as to produce the desired final material characteristics of the dielectric material 110, thereby also enhancing adhesion of the layer 110 to a lower lying material layer, such as the substrate 101. The heat treatment 104 may be performed on the basis of appropriate process parameters, which may readily be determined by experiment, wherein an exemplary process temperature may be in the range of 180° C. to 350° C. for a time interval of 2 to 4 hours. Consequently, in this manufacturing stage the pattern 120 is transferred into the dielectric material 110, which may now have the desired material characteristics so as to provide the dielectric components of the device 100 after receiving a conductive polymer material. Hence, in this manufacturing stage the structure 120 is to be understood as a trench pattern comprising respective trench portions, which in the cross-section shown in FIG. 1e correspond to trench portions 121 and 122 representing a part of the gate electrode and the channel region 127, 126, respectively (cf. FIG. 1a).

Figure 1E:
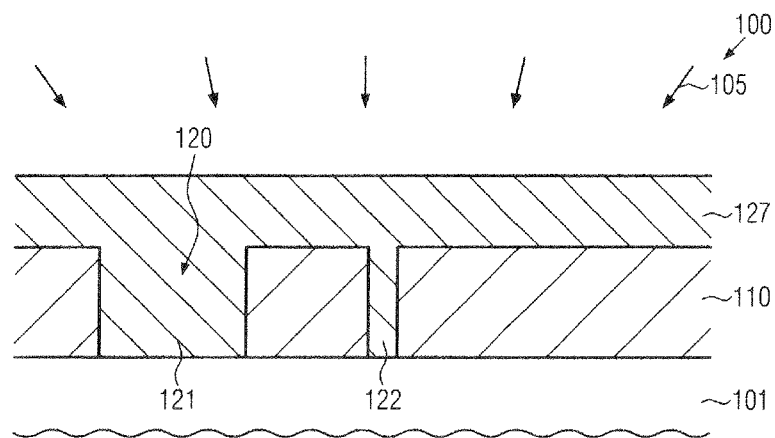

FIG. 1e schematically illustrates a cross-sectional view of the device 100 after the deposition of a conductive polymer material 127, such as doped PEDOT:PSS, or any other appropriate conductive polymer material that allows the fabrication of an electrochemically active structure. The deposition of the material 127 may be accomplished on the basis of any appropriate deposition process 105, for example a spin-coating process based on appropriate process parameters, such as 1000 rounds per minute for 30 seconds, thereby forming a continuous layer above the dielectric material 110 and also completely filling the trench pattern 120. It should be appreciated, however, that any other process parameters may readily be determined for any type of conductive polymer material in order to achieve a complete filling of the trench pattern 120. The above-indicated exemplary process parameters may be applied in combination with a commercially available PEDOT:PSS solution known as Clevios PH1000, which may be doped with 5% v/v dimethyl sulphoxide. However, any other "dopants" may be used in combination with PEDOT:PSS.

In another embodiment the material 127 may not completely fill the trench pattern 120 forming a continuous conductive layer below the dielectric material 110 edge.

Figure 1F:
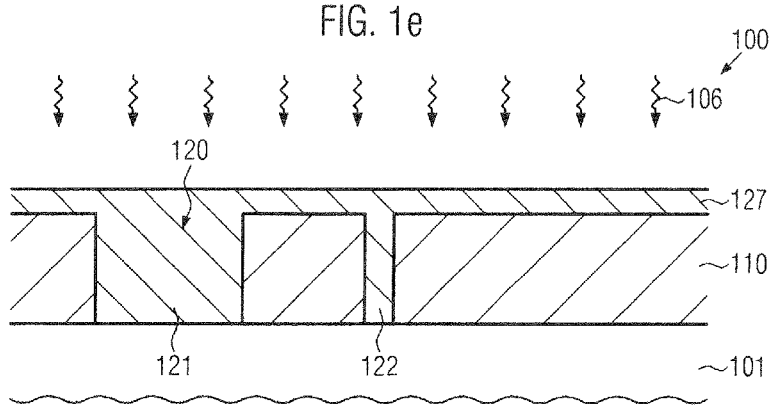

FIG. 1f schematically illustrates the device 100 during a further heat treatment 106, which is applied so as to remove water or other solvent from the previously deposited material 127. To this end, an appropriate temperature and process time may be determined, for instance on the basis of experiments so as to induce the desired shrinking of the layer 127 due to the evaporation of water. For example, the heat treatment 106 may be performed at a temperature of approximately 100-150° C. for 20 to 40 min. It should be appreciated, however, that other process parameters may readily be determined on the basis of experiments.

Figure 1G:
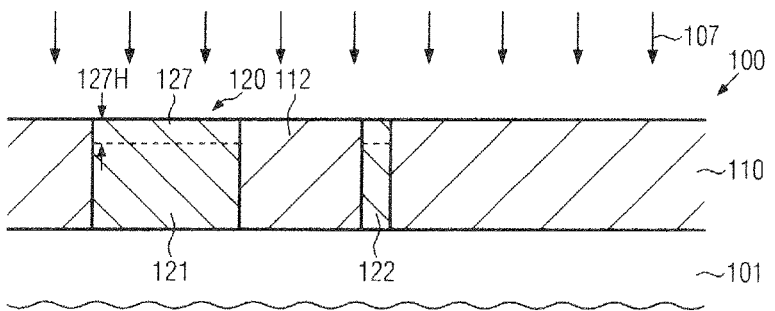

FIG. 1g schematically illustrates the device 100 in a further advanced manufacturing stage, in which a material removal process 107 is applied so as to remove any excess portion of the material 127. In one illustrative embodiment the material removal process 107 includes an etch process performed on the basis of an oxygen plasma ambient, wherein appropriate process parameters may readily be determined on the basis of well-established process recipes for removing polymer materials by an oxygen plasma treatment. For example, plasma power, gas flow rates, pressure, and the like may readily be determined on the basis of well-established recipes and corresponding experiments in order to determine an etch rate of the material 127 during the process 107. Consequently, the material 127 may reliably be removed outside of the trench pattern 120, thereby forming the desired conductive pattern, which is laterally embedded in the dielectric material 110. For example, the dielectric portion 112 provides for the electrical insulation between the trench portions 121 and 122, which may be portions of the gate electrode 123 and the channel region 126, respectively, as discussed above with reference to FIG. 1a. It should be appreciated that the process parameters of the corresponding oxygen-based plasma treatment may be selected such that significant material erosion of the dielectric material 110 may be avoided. Hence, the material 127 may reliably be removed from surface areas of the dielectric material 110, while also a target height 127H may be adjusted in the trench portions 121, 122 in compliance with specifications for the conductivity of the trench pattern 120. Consequently, the actual "patterning" of the conductive polymer material 127 may be accomplished on the basis of a non-masked removal process, which may also be used for adjusting a desired height and thus thickness of the conductive lines to be formed in the trench pattern 120.

In other illustrative embodiments, the material removal process 107 may comprise a mechanical removal process, such as a polishing process, possibly in combination with an appropriate chemical treatment, for instance in the form of a chemical mechanical planarisation process (CMP), in order to remove at least a part of any excess portion of the material 127. CMP processes are well-established process techniques, in which one or more materials may efficiently be removed while at the same time obtaining a substantially planar surface topography. For example, upon selecting appropriate polishing parameters, which may readily be determined on the basis of experiments, excess material of the layer 127 may be removed so as to reliably clear the surface areas of the dielectric layer 110. If desired, during a subsequent polishing phase the total height of the dielectric material 110 and the conductive polymer material 127 may be adjusted in accordance with various device requirements, while still maintaining a substantially planar surface geometry.

In other illustrative embodiments, the material removal process 107 may comprise an etch step and a polishing step, if, for instance, exposure to the etch ambient is to be reduced in order to avoid a surface modification of the material 127, and the like. For example, in one embodiment the process 107 may start with a polishing process to clear the surface areas of the dielectric material 110, while a final adjustment of the height 127H may be accomplished on the basis of a short oxygen-based etch process or on the basis of any other etch step. In this case, exposure to an etch ambient, in particular of the dielectric material 110, may significantly be reduced. In other illustrative embodiments, the process 107 may begin with an etch process so as to remove an essential part of the excess portion of the material 127, for instance prior to actually clearing the surface areas of the dielectric material 110. Thereafter, a short polishing process may be applied so as to reliably clear the surface areas of the dielectric material 110, thereby also removing surface areas of the material 127 that may have possibly been modified during the previous etch process and also avoiding direct exposure of the dielectric material 110 to the etch ambient.

Consequently, the trench pattern 120 may reliably be filled with the conductive polymer material 127 so as to obtain the desired conductive structure embedded in the dielectric material 110 without requiring any additional masking processes and also avoiding complex processes for removing sacrificial materials, and the like, as is typically necessary in conventional process strategies, as discussed above. Furthermore, undue material modification may substantially be avoided, since a corresponding oxygen plasma may substantially affect a very thin surface portion of the materials 110 and 127, while any deeper areas may substantially not be modified. Furthermore, by applying at least one polishing step an exposure of sensitive materials to an etch ambient may even further be reduced or substantially completely be avoided.

In a further embodiment (not shown) the trench pattern 120 may be alternatively filled with a sacrificial layer of a radiation sensitive material which after radiation exposure and development using photolithography technique takes on the same trench pattern of the underlying dielectric material 110. A superficial treatment, such as oxygen plasma or chemical modification by covalent bond with suitable molecules, allows channels 121, 122 to become strongly hydrophilic in the trench pattern 120. After removal of the sacrificial layer, channels 121, 122 may be filled by spin-coating or inkjet printing with conductive material 127 due to a capillarity effect caused by a periodicity of the hydrophobic material 110 and hydrophilic channels 121, 122.

In a further embodiment (not shown) the trench pattern 120 may be treated in oxygen plasma ambient in order to activate a hydrophilic behavior. The further selective deposition on dielectric material 110 of a hydrophobic layer by contact with a pretreated surface leads to a selective pattern: strongly hydrophobic layer corresponding to dielectric material 110 edges and hydrophilic channels 121, 122. These channels are further filled by spin-coating or inkjet printing with the conductive material 127 due to a capillarity effect caused by a periodicity of hydrophobic material 110 and hydrophilic channels 121, 122.

Figure 1H:
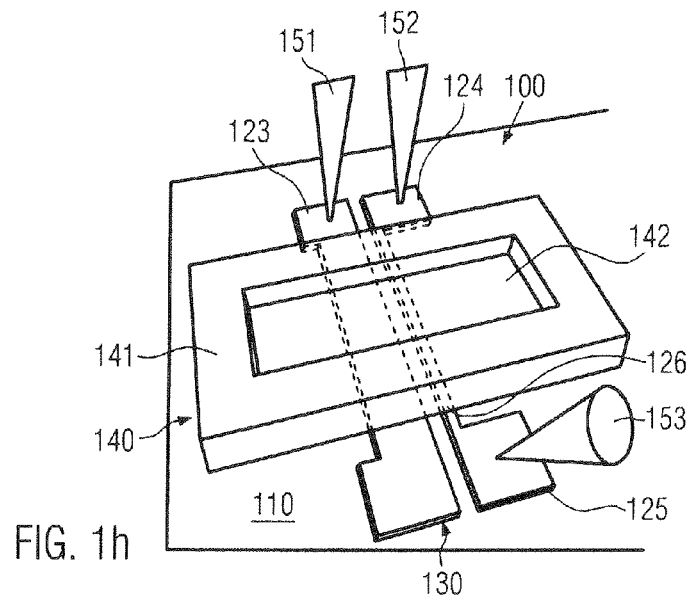
FIG. 1h schematically illustrates a perspective view of the microstructure device realized in the form of a transistor with a sense structure, which affects the conductivity modulation of a channel region of the transistor.

FIG. 1h schematically illustrates a perspective view of the device 100 in a further advanced manufacturing stage. In this example the microstructure 130, provided in the form of an electrochemical transistor having a layout as discussed above with reference to FIG. 1a, may be completed by a sensor structure 140, which comprises an edge region 141, for instance provided as any appropriate dielectric material, such as a polymer material, and the like, and an electrolyte solution with, if needed, a mediator 142 laterally confined by the edge region 141, which may provide for charge carrier transportation between the gate electrode 123 and a substance that comes into contact with the sensor structure 140. It should be appreciated, however, that the two-dimensional transistor configuration provided in the form of the microstructure 130 may have any other geometric configuration and may be used in combination with other electrolyte solutions so as to implement the desired electronic function. In the example shown in FIG. 1h a very sensitive sensor structure may be established on the basis of the transistor 130 in combination with the sensor structure 140, for instance for detecting glucose, as for instance described by Shim et al, in Sensors 9 (2009), 9896-9902.

Furthermore, the transistor structure 130 may be connected to the periphery by an appropriate contact regime, which is schematically illustrated in the form of contact elements 151, 152 and 153 so as to electrically connect to the gate electrode 123, the source terminal 124 and the drain terminal 125.

Figure 2A:
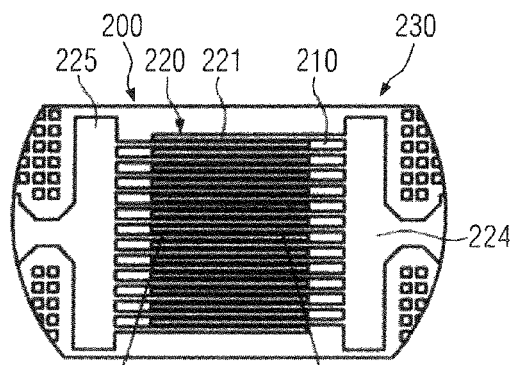
FIGS. 2a and 2b schematically illustrate top views of a microstructure provided in the form of an electrode structure with interdigitated electrodes formed on the basis of the principles disclosed herein.

FIG. 2a schematically illustrates a top view of an electronic device 200, which may include a microstructure 230 formed on the basis of a conductive polymer material. In the example shown, the microstructure 230 may represent an electrode structure comprising terminals 225 and 224, each of which is connected to a comb-like pattern 220, which thus forms an interdigitated electrode structure. That is, the structure 230 is laterally embedded in a dielectric material 210, such as polyimide, and the like while the conductive areas 225, 224 and 220 are comprised of the conductive polymer material which is "patterned" on the basis of process techniques described above with reference to the device 100. That is, the dielectric material 210 may be patterned by optical lithography techniques so as to receive an appropriate trench pattern corresponding to the layout of the areas 224, 225 and the interdigitated structure 220. As is evident from FIG. 2a the corresponding trench pattern 220 is formed so as to have at least one lateral dimension that is significantly less than 100 µm. In the example shown, the width of an individual portion of the structure 220, indicated by 221, may be approximately 10 µm, which may reliably and reproducibly be formed in the dielectric material 210 on the basis of well-established lithography techniques described above. Thereafter, the conductive polymer material may be filled in and processed so as to remove any excess portion thereof, as discussed above.

Figure 2B:
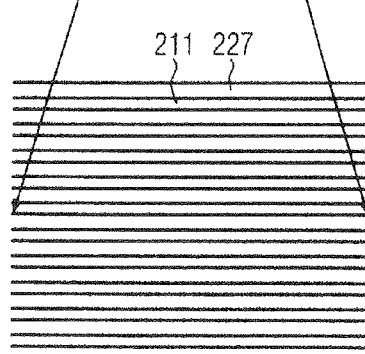

FIG. 2b is a magnified view of the interdigitated structure 220, wherein individual electrode portions comprised of a conductive polymer material 227 are laterally separated by corresponding dielectric portions 211 having a lateral width of several micrometers or even less, depending on overall geometric requirements of the interdigitated structure 220. Consequently, even in finely patterned structures the conductive polymer material may be provided in a reliable manner so as to be laterally embedded in the dielectric material 210, wherein the highly efficient process strategy discussed above may be applied without requiring sacrificial materials and additional process steps, as is the case in conventional strategies.

It should be appreciated that conductivity measurements performed on the electrode structure of FIG. 2b indicate a high conductivity, for instance in the terminals 224, 225 in the range of approximately 80 to 200 S/cm and an electrical isolation among terminals 224, 225 and interdigitated structures 220, thereby confirming that high-conductivity areas, such as drain and source terminals, and the like, as well as areas of controllable of modulated conductivity may efficiently be formed on the basis of the same conductive polymer material by selecting an appropriate geometric layout.

As a result, the present disclosure provides an efficient patterning process, in which a plurality of components of an electronic device in micrometer dimensions may be formed in a single layer of a dielectric material, which may directly be patterned on the basis of optical lithography techniques. In this manner, a desired electronic structure, in particular electrochemical transistors including a channel region, source and drain terminals and a gate electrode may be formed on the basis of a single patterning process, in which a corresponding trench pattern is provided in the dielectric material of the device that is subsequently filled with the conductive polymer material. In this manner even polymer materials that are critical with respect to chemicals used in optical lithography techniques, such as PEDOT:PSS, may efficiently be used in combination with well-established optical lithography techniques without requiring sacrificial materials and liftoff techniques, as are frequently applied in conventional strategies. Furthermore, if desired, instead of patterning the dielectric material by means of optical lithography processes, in other illustrative embodiments the patterning of the dielectric material may be accomplished on the basis of imprint techniques, if considered appropriate. Furthermore, the one-layer patterning strategy of the present disclosure may also be applied in several device levels, if a three-dimensional configuration of a microstructure device is required. To this end, the above described patterning sequence may individually be applied in each device level, wherein an electrical contact between the individual device levels may readily be implemented by applying one additional etch step upon forming a trench pattern. That is, when forming a trench pattern in a higher device level additional contact openings may be provided prior to depositing the conductive polymer material of the device level under consideration, thereby providing a respective contact to a lower lying conductive pattern.

The various embodiments described above can be combined to provide further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A method, comprising:
forming a trench pattern in a dielectric material, said dielectric material being located above a substrate;
depositing a conductive polymer material above said substrate and in said trench pattern;
heat treating said conductive polymer material after depositing the conductive polymer material above said substrate;
forming a conductive polymer microstructure that is laterally isolated by said dielectric material; and
creating a pattern that includes a hydrophobic layer that corresponds to the dielectric material and hydrophilic channels inside the trench pattern by
performing an oxygen plasma treatment to activate hydrophilic behavior on the trench pattern; and
selectively depositing the hydrophobic layer on a surface of the dielectric material.

2. The method of claim 1, wherein forming said trench pattern comprises depositing a precursor of said dielectric material as a radiation sensitive material and forming said trench pattern by applying a radiation based lithography process.

3. The method of claim 2, wherein applying said radiation based lithography process comprises exposing portions of said dielectric material to radiation and removing one of said exposed or unexposed portions.

4. The method of claim 1, further comprising heating said dielectric material and said substrate after forming said trench pattern and prior to depositing said conductive polymer material.

5. The method of claim 1, further comprising removing an excess portion of said conductive polymer material.

6. The method of claim 5 wherein the eat treating said conductive polymer material occurs before removing an excess portion of said conductive polymer material.

7. The method of claim 5, wherein removing said excess portion of said conductive polymer material comprises etching said excess portion of said conductive polymer material.

8. The method of claim 7, wherein etching said excess portion comprises using a plasma ambient process.

9. The method of claim 5, wherein removing said excess portion of said conductive polymer material comprises performing a polishing process.

10. The method of claim 1, wherein depositing said conductive polymer material comprises filling said trench pattern without causing an excess portion to form over edges of said trench pattern.

11. The method of claim 1, wherein forming said trench pattern comprises forming said trench pattern so as to laterally correspond to a layout of at least a portion of a transistor.

12. The method of claim 11, wherein said at least a portion of the layout comprises a drain terminal, a source terminal, a channel and a gate electrode.

13. The method of claim 1, wherein forming a trench pattern in said dielectric material comprises forming at least one trench portion that has at least one lateral dimension that is less than 100 μm (micrometer).

14. The method of claim 1 wherein heat treating said conductive polymer material shrinks said conductive polymer material.

15. A method of forming a polymer microstructure, the method comprising:
using an optical lithography process to transfer a layout of a conductive pattern of a microstructure as a trench pattern in a dielectric material, said dielectric material being used as a radiation sensitive material during said optical lithography process;
filling said trench pattern with a conductive polymer material;
heat treating said conductive polymer material after filling said trench pattern with the conductive polymer material;
performing an oxygen plasma treatment to activate hydrophilic behavior on the trench pattern; and
selectively depositing a hydrophobic layer on a surface of the dielectric material, thereby creating a pattern that comprises said hydrophobic layer that corresponds to the dielectric material and hydrophilic channels inside the trench pattern.

16. The method of claim 15, wherein said layout comprises a drain terminal, a source terminal, a channel and a gate electrode of an electrochemical transistor.

17. The method of claim 15, wherein filling said trench pattern comprises depositing said conductive polymer material and removing a portion of said conductive polymer material to adjust a target height of said conductive polymer material in said trench pattern after heat treating said conductive polymer material.

18. The method of claim 17, wherein removing said portion of said conductive polymer material comprises using a plasma based etch process.

19. The method of claim 17, wherein removing said portion of said conductive polymer material comprises using a polishing process.

20. The method of claim 19, wherein filling said trench pattern comprises spin coating or inkjet printing said conductive polymer material in hydrophilic channels based on a capillarity effect and removing said portion of said conductive polymer material comprises adjusting a target height of said conductive polymer material in said trench pattern.

21. The method of claim 20, wherein removing said portion of said conductive polymer material comprises applying a plasma based etch process.

22. The method of claim 17, further comprising depositing a sacrificial layer of a radiation sensitive material above said trench pattern and transferring said trench pattern to the sacrificial layer.

23. The method of claim 22, further comprising performing a superficial treatment to selectively activate hydrophilic channels in the said trench pattern.

24. The method of claim 23, further comprising removing said sacrificial layer.

25. The method of claim 15, wherein depositing said conductive material comprises spin coating or inkjet printing the conductive material in said hydrophilic channels based on a capillarity effect and removing a portion of said conductive polymer material comprises adjusting a target height of said conductive polymer material in said trench pattern.

26. The method of claim 15, wherein said trench pattern comprises a drain terminal, a source terminal, a channel and a gate electrode of an electrochemical transistor.

27. The method of claim 15 wherein heat treating said conductive polymer material shrinks said conductive polymer material.

28. A method comprising:
- depositing a dielectric material over a surface of a substrate;
- exposing first portions of the dielectric material to radiation while second portions of the dielectric material remain unexposed;
- forming a trench pattern by removing one of the first portions or the second portions;
- filling said trench pattern with a conductive polymer material;
- heat treating said conductive polymer material after filling said trench pattern with the conductive polymer material;
- selectively depositing a hydrophobic layer on a surface of the dielectric material; and
- performing an oxygen plasma treatment to activate hydrophilic behavior on the trench pattern, thereby creating a pattern that comprises said hydrophobic layer that corresponds to the dielectric material and hydrophilic channels inside the trench pattern.

29. The method of claim 28 wherein said conductive polymer material is doped PEDOT:PSS.

30. The method of claim 28 wherein heat treating said conductive polymer material shrinks said conductive polymer material.

31. The method of claim 28 wherein filling said trench pattern with a conductive polymer material further comprises:
- depositing said conductive polymer material over an upper surface of said dielectric; and
- removing portions of said conductive polymer material after heat treating said conductive polymer material.

32. The method of claim 28 wherein depositing said dielectric material over said surface of said substrate further comprises depositing said dielectric material directly on said surface of said substrate.

* * * * *